United States Patent [19]

Le

[11] 4,276,617
[45] Jun. 30, 1981

[54] TRANSISTOR SWITCHING CIRCUITRY

[75] Inventor: Hiep T. Le, Sunnyvale, Calif.

[73] Assignee: Raytheon Company, Lexington, Mass.

[21] Appl. No.: 53,125

[22] Filed: Jun. 28, 1979

[51] Int. Cl.³ ............................................. G11C 7/00
[52] U.S. Cl. ..................................... 365/189; 365/94; 307/DIG. 1
[58] Field of Search ................... 365/94, 96, 103, 104, 365/189; 307/DIG. 1

[56] References Cited

U.S. PATENT DOCUMENTS 4,125,880  11/1978  Taylor ..................................... 365/96

FOREIGN PATENT DOCUMENTS 2505285  8/1976  Fed. Rep. of Germany ............. 365/96

*Primary Examiner*—Stuart N. Hecker

*Attorney, Agent, or Firm*—Richard M. Sharkansky; Joseph D. Pannone

[57] ABSTRACT

A transistor logic circuit wherein a selector is coupled to a pullup resistor and output sense amplifier through an isolation transistor. The selector includes a plurality of transistors having emitter electrodes coupled to a plurality of input terminals, base electrodes coupled to control signals and collector electrodes connected to a common output terminal. The isolation transistor has its base electrode coupled to a reference voltage and its emitter and collector electrodes serially coupled between the output terminal and the pullup resistor and output sense amplifier. Control signals fed to the base electrodes of the plurality of transistors couples a selected one of the input terminals to the output terminal. The logic state of a signal at such selected input terminal is sensed by the sense amplifier. The isolation transistor isolates the large capacitance produced as a result of connecting the collector electrodes together from the switching action of the sense amplifier.

14 Claims, 2 Drawing Figures

TRANSISTOR SWITCHING CIRCUITRY

BACKGROUND OF THE INVENTION

This invention relates generally to transistor switching circuitry and more particularly to transistor logic switching circuitry.

As is known in the art, transistor logic switching circuitry is used extensively, as, for example, in memory circuits and selector/multiplexer circuits. In one class of such circuits it is sometimes desired to couple one of the plurality of logic signals to an output selectively in accordance with control signals. For example, in a read only memory application wherein a matrix of fusible links is programmed in a predetermined manner, it is generally desired to detect whether or not a selected one or ones of such fusible links has been programmed in a particular state, that is, blown or not blown. Here the rows of fusible links are coupled to a selector which, in response to the control signals, couples one of the rows to the output. In many circuits of such type the selector includes a plurality of transistors, each one thereof having an emitter electrode coupled to a corresponding one of the columns of the matrix. The collector electrodes of such transistors are connected together at a common terminal, such terminal being coupled to a voltage source through a pullup or load resistor. A diode matrix is coupled to the base electrodes of the plurality of transistors and, in response to the control signals, enables the selection of one of such transistors to couple the column of the matrix of fusible links to the load or pullup resistor. The voltage produced at the common terminal depends upon the programmed state of the fusible link. When such circuit is designed using transistor-transistor-logic (TTL) circuitry, the voltage produced at the common terminal may change typically from between 0.3 volts to +Vcc (i.e., in the order of +5 volts). Because the selector includes a plurality of transistors having common collectors, the capacitance associated with each collector has a cumulative effect on the total capacitance of the circuit. The net result is an increase in the time required for the voltage at the common terminal to swing towards +Vcc, hence increasing the switching time of the memory. One technique used to reduce the switching time has been to limit or clamp the voltage at the common terminal as it goes towards ground or +0.3 volts to some intermediate voltage level. While such technique has reduced the switching time in some applications, it has not reduced the switching time sufficiently in many other applications.

SUMMARY OF THE INVENTION

In accordance with the present invention, an electronic circuit is provided wherein such circuit includes: Network means for electrically coupling one of a plurality of conductors to a common terminal selectively in accordance with a control signal, such means including a plurality of transistors, each one having emitter and collector electrodes, one of such electrodes of each one of the plurality of transistors being connected to the common terminal and each one of the other ones of such electrodes of such plurality of transistors being coupled to a corresponding one of the plurality of conductors; an output network; and, a transistor having emitter and collector electrodes, one of such electrodes being coupled to the common terminal and the other one of such electrodes being connected to the output network.

In a preferred embodiment of the invention a memory array having a matrix of rows and columns of conductors is provided. Transistor-transistor-logic (TTL) circuitry provides row addressing circuitry for the memory array and is coupled to the rows of conductors. The columns of conductors of the matrix are coupled to the network means, a selected one of such column of conductors being electrically coupled to the common terminal selectively in response to the control signal. In particular, the columns of conductors are connected to corresponding ones of the emitter electrodes of the plurality of transistors of the network means. The collector electrodes of such plurality of transistors are coupled together at the common terminal. The transistor coupled between the common terminal and the output network has its emitter electrode connected to the common terminal and its collector electrodes connected to a voltage source through a pullup resistor in the output network. Such transistor provides an isolation or buffer transistor for the circuit. A voltage reference source is coupled to the base electrode of such isolation transistor. The output network includes an output circuit having an input connected to the both the collector electrode of the isolation transistor and the pullup resistor.

With such arrangement when the control signal fed to the network means changes from selecting one of the plurality of transistors having a low voltage at the emitter electrode thereof (producing a low voltage at the common terminal) to selecting one of the plurality of transistors having a high voltage at the emitter electrode thereof, as the collector electrode of such currently selected transistor tends towards the voltage of the voltage source a relatively small change in the voltage at the emitter electrode of the isolation transistor causes a large change in the collector current of such isolation transistor. This large change in collector current is sensed by the output network, rapidly switching the state of a logic signal produced by such network. The isolation transistor may be considered as isolating the large capitance produced as a result of connecting the collector electrodes of the plurality of transistors together from the switching action of the output network, thereby reducing the switching time of the circuit. That is, the use of the isolation transistor reduces the effect of the large time constant at the common terminal by isolating the large parasitic capacitance resulting from connecting the collector electrodes of the plurality of transistors together. This is done by inserting the isolation transistor between the pullup resistor and such plurality of transistors with such isolation transistor being biased in such a way that it will conduct current when an addressed fusible link is present.

BRIEF DESCRIPTION OF THE DRAWINGS

The foregoing features of this invention, as well as the invention itself, may be more fully understood from the foregoing detailed description read together with the accompanying drawings, in which.

DESCRIPTION OF THE PREFERRED EMBODIMENTS

Figure 1:
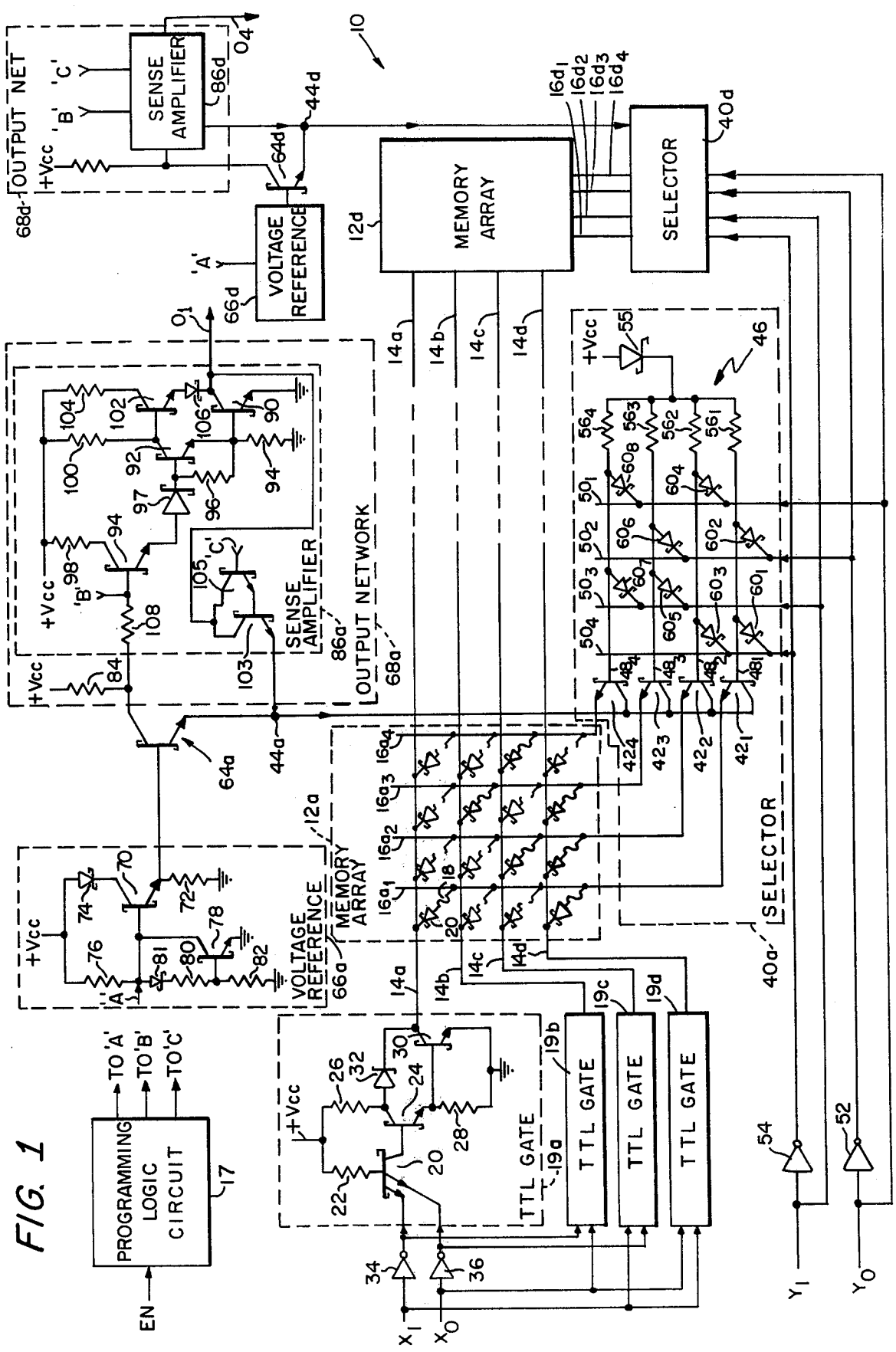
FIG. 1 is a schematic diagram of a programmable read only memory according to the invention.

Referring now to FIG. 1, a programmable read only memory (PROM) 10 is shown. While here such memory 10 is adapted to store 64 bits arranged as sixteen four-bit digital words, it should be understood that the capacity of the memory 10 typically is in the order of 8000 bits. Memory 10 here includes four memory arrays, 12a to 12d, each one of such arrays 12a to 12d including a matrix of rows and columns of conductors having Schottky diodes and serially coupled fusible links connected between corresponding pairs of the rows and columns of conductors, as shown. In particular, the memory arrays 12a to 12d include row columns 14a to 14d, such conductors 14a, 14b, 14c and 14d being connected to all the arrays 12a to 12d, as shown. Each one of the arrays includes a set of four column conductors; memory arrays 12a through 12d having column conductors $16a_1$, $16a_2$, $16a_3$, $16a_4$ through $16d_1$, $16d_2$, $16d_3$, $16d_4$, respectively, as shown. The memory arrays 12a through 12d include fusible links 18 and serially coupled Schottky diodes 20 electrically connected to a selected one of the row conductors 14a–14d and a selected one of the column conductors $16a_1$–$16d_4$, using any conventional programming logic circuit 17. For example, such fusible links 18 and Schottky diodes 20 are electrically connected here between the following row and column conductors for memory array 12a: Row conductor 14a and column conductor $16a_1$; row conductor 14b and and column conductor $16a_3$; row conductor 14c and column conductor $16a_2$; row conductor 14c and column conductor $16a_4$; row conductor 14d and column conductor $16a_1$; row conductor 14d and column conductor $16a_2$; and row conductor 14b and column conductor $16a_3$, as shown. The remaining fusible links having been blown or fused in a conventional manner by the programming logic circuit 17. As will be described, the connection of a fusible link 18 and serially connected Schottky diode 20 represents a logical 1 state stored by the memory 10 at the location represented by the row and column conductors connected thereto, while the absence of a fusible link electrically connected between a row and column of conductors represents a logical 0 being stored by the memory 10 at the location represented by such row and column of conductors. Thus, here, for example, logical 1 states are stored at the following locations: Row 14a, column $16a_1$; row 14b, column $16a_3$; row 14c, column $16a_2$; row 14c, column $16a_4$; row 14d, column $16a_1$; row 14d, column $16a_2$; row 14d, column $16a_3$. Logical 0 states are stored in the remaining locations.

Each one of the row conductors 14a–14d is connected to a corresponding transistor-transistor-logic (TTL) gate 18a–18d, as shown. Each one of such TTL gate 19a–19d is identical in construction and is of conventional design. Thus, an exemplary one of such TTL gates 19a–19d, here TTL gate 19a, includes a Schottky transistor 20 having a pair of emitter electrodes which are coupled to a pair of inputs for the gate 19a; a base electrode connected to a $+V_{cc}$ voltage source, here +5 volts, through a resistor 22, as shown; and a collector electrode connected to the base of Schottky transistor 24, as shown. The collector of transistor 24 is connected to $+V_{cc}$ through resistor 26 and the emitter electrode of such transistor 24 is connected to ground through a resistor 28, as shown. The base electrode of Schottky transistor 30 is connected to the emitter electrode of transistor 24, as shown. The emitter electrode of transistor 30 is connected to ground and the collector electrode of such transistor 30 is connected to: The collector of transistor 24 through a Schottky diode 32; and to row conductor 14a, as shown. The pair of inputs to the TTL gate 19a is connected to a pair of X address terminals $X_0$, $X_1$ through inverters 34, 36, as shown. One of the pair of inputs of TTL gate 19b is connected to terminal $X_0$ and the other one of such inputs is connected to the output of inverter 34, as shown. One of the pair of inputs to TTL gate 19c is connected to the output of inverter 36 and the other one of such inputs is connected to terminal $X_1$. The pair of inputs to TTL gate 19d is connected to terminal $X_0$ and $X_1$, as shown. It follows, then, that if the addressing signals fed to address terminals $X_1$, $X_0$ are both low, that is, logical 0 signals, transistor 30 turns on and the voltage on conductor 14a is low, typically +0.3 volts; thus, as will become apparent, addressing conductor 14a. Likewise, if the address signal on terminal $X_1$ is low (a logical 0 signal) and the address signal on terminal $X_0$ is high (a logical 1 signal) the voltage at conductor 14b goes low and row conductor 14b is addressed. Still likewise, the logical signals at terminals $X_1$, $X_0$ are 10, conductor 14c is addressed and if the signals at such terminals $X_1$, $X_0$ are 11, conductor row 14d is addressed.

Each set of four column conductors $16a_1$–$16a_4$ through $16d_1$–$16d_4$ of memory arrays 12a through 12d is coupled to one of a plurality of (here four) selector networks 40a–40d, as shown. Each one of the selector networks 40a–40d is identical in construction. An exemplary one thereof, here selector network 40a, is shown to include a plurality of, here four, Schottky transistors $42_1$–$42_4$, such transistors having collector electrodes connected together at a common terminal 44a, as shown. Each one of such transistors $42_1$–$42_4$ has an emitter electrode connected to a corresponding one of the column conductors $16a_1$–$16a_4$, respectively, as shown. The base electrodes of transistors $42_1$–$42_4$ are connected to a diode matrix 46, as shown. In particular, the base electrodes of transistors $42_1$–$42_4$ are connected to row conductors $48_1$–$48_4$ of such matrix 46, as shown. Column conductors $50_1$–$50_4$ are provided, as shown. In particular, column conductor $50_1$ is connected to Y addressing terminal $Y_0$; column conductor $50_2$ is connected to terminal $Y_0$ through an inverter 52, as shown; column conductor $50_3$ is connected to Y address terminal $Y_1$, as shown; and column conductor $50_4$ is connected to terminal $Y_1$ through an inverter 54, as shown. It is also noted that row conductors $48_1$–$48_4$ are connected to a $+V_{cc}$ voltage source through a Schottky diode 55 and resistors $56_1$–$56_4$, respectively, as shown. Schottky diodes $60_1$–$60_8$ are connected, as shown, between row and column conductors $48_1$–$48_4$, $50_1$–$50_4$, selectively, as shown. In operation, when the signals at terminals $Y_0$, $Y_1$ are both low (representing logical 0 states) current from the $+V_{cc}$ voltage source is able to pass to the base electrode of transistor $42_1$; however, diodes $60_4$, $60_5$, $60_7$ and $60_8$, providing a short circuit path through such diodes inhibiting substantial base current from flowing to the base electrodes of transistors $42_2$ through $42_4$. That is, the logical 0 signals at terminals $Y_0$, $Y_1$ effectively select or address transistor $42_1$. In like manner: A logical 1 signal at terminal $Y_0$ and a logical 0 signal at terminal $Y_1$ selects transistor $42_2$; a logical 0 signal at terminal $Y_0$ and a logical 1 signal at terminal $Y_1$ select transistor $42_3$; and logical 1 signals at both terminals $Y_0$ and $Y_1$ select transistor $42_4$.

Buffer or isolation Schottky transistors 64a–64d have their emitter electrodes connected to corresponding ones of the common terminals 44a–44d, as shown. The base electrodes of such isolation transistors 64a–64d are connected to voltage reference circuits 66a–66d, respectively, as shown. The collector electrodes of such transistors 64a–64d are connected to output networks 68a–68d, repsectively, as shown. Each one of the voltage reference circuits 66a–66d is identical in construction. An exemplary one thereof, here circuit 66a, includes an output transistor 70 having its emitter electrode connected to the base electrode of isolation transistor 64a and to ground through a resistor 72, as shown. The collector electrode of transistor 70 is connected to $+V_{cc}$ through a diode 74, as shown. The base electrode of transistor 70 is connected to $+V_{cc}$ through a resistor 76 to the programming logic circuit 17 at terminal "A", as shown, and is also connected to the collector electrode of transistor 78 and to the base electrode of transistor 78 through a Schottky diode 81 and serially connected resistor 80. The Schottky diode 81 is formed on a common substrate (not shown) or chip with the other components of the memory 10 for temperature compensation, as will be desribed. The emitter electrode of transistor 78 is connected to ground and the base electrode of such transistor is connected to ground through resistor 82. Voltage reference circuitry 66a is designed to produce a reference voltage $V_R$ at the base electrode of transistor 64a, such voltage $V_R$ here being in the order of 3.8 $V_{BE}$ (approximately 3.0 volts) for reasons to become apparent hereinafter. Transistor 78 is biased on by biasing resistors 76, 80 and 82 establishing 0.8 volts at the base electrode of such transistor. The voltage across resistor 80, $V_{80}$, may be represented as $V_{80} = (0.8/R_{82})R_{80}$, where $R_{82}$ is the resistance of resistor 82 and $R_{80}$ is the resistance of resistor $R_{80}$. The voltage at the base electrode of transistor 70, $V_{70}$, may be represented as $V_{70} = V_{80} + 0.8 + V_S$, where $V_S$ is the voltage drop across the Schottky diode 81 (here 0.6 volts). The voltage $V_{70}$ is selected to establish 3.8 $V_{BE}$ (where $V_{BE}$ is the base-to-emitter voltage of a transistor) at the emitter of transistor 70, and, therefore, $V_{70}$ must be 4.8 $V_{BE}$ (or 3.8 volts). Consequently, $R_{80}/R_{82} = 3$. Typically, $R_{82}$ is $5^k$ ohms.

Output networks 68a–68d are each identical in construction and have output lines $O_1$–$O_4$ as shown, an exemplary one thereof, here output network 68a, is shown to include a pullup resistor 84 connected between $+V_{cc}$ and the collector electrode of isolation transistor 64a, as shown. Output network 68a also includes a sense amplifier 86a having its input connected to the collector electrode of transistor 64a and the pullup resistor 84, as shown. Sense amplifier 86a includes an output Schottky transistor 90 having its emitter connected to ground, its base electrode connected to the emitter electrode of Schottky transistor 92 and to ground, through resistor 94, as shown. The base electrode of transistor 92 is connected to the emitter electrode of such transistor through resistor 96, as shown, and such base electrode is connected to the emitter electrode of Schottky transistor 94 through a Schottky diode 97, as shown. The collector electrode of transistor 94 is connected to $+V_{cc}$ through a resistor 98, as shown. Likewise, the collector electrode of transistor 92 is connected to $+V_{cc}$ through a resistor 100, as shown, and is connected to the base electrode of Schottky transistor 102, as shown. The collector electrode of transistor 102 is connected to $+V_{cc}$ through a resistor 104, as shown, and the emitter electrode of such transistor 102 is connected to the collector electrode of transistor 90 through a Schottky diode 106, as shown. The base electrode of transistor 94 is connected to the pullup resistor 84 and the collector electrode of coupling transistor 64 through a resistor 108, as shown and to the programming logic circuit 17 at terminal "B". The collector electrode of transistor 90 provides the output for the output network 68a on line $O_1$, as shown. Also included in the output circuit 68a, for programming purposes, is a pair of transistors 103, 105 having collector electrodes connected together and to the collector of transistor 90 as shown; the base electrode of transistor 105 is connected to the programming logic circuit 17 at terminal "C", as shown; the emitter electrode of transistor 105 is connected to the base electrode of transistor 103, as shown; and the emitter electrode of transistor 103 is connected to the common terminal 44a, as shown.

In operation, let us consider the condition where it is desired to address row conductor 14a and column conductors $16a_1$ through $16d_1$ of memory arrays 12a through 12d. Here, logical 0 signals are applied to terminals $X_0$ and $X_1$ and terminals $Y_0$ and $Y_1$. As described, the logical signals on terminals $Y_0$ and $Y_1$ enable current from the $+V_{cc}$ voltage source to pass to the base electrode of transistor $42_1$ and the logical 0 signals at address terminals $X_0$ and $X_1$ provide a relatively low voltage in the order of 0.3 volts at the cathode of the Schottky diode 20 which is connected to row conductor 14a. In response to such address signals current passes from the $+V_{cc}$ supply through pullup resistor 84, through isolation transistor 64a, through the collector electrode of transistor $42_1$, the emitter electrode of such transistor $42_1$, through the fusible link 18, selected Schottky diode 20, collector electrode of transistor 30 of TTL gate $19_a$ to the emitter electrode of such transistor 30 and finally back to the supply through ground. As described, the voltage reference circuit 66a produces a reference voltage $V_R$ in the order of 3.8 $V_{BE}$ (or about 3.0 volts) at the base electrode of isolation transistor 64a. Because such isolation transistor 64a is biased to conduct under this addressed condition, and because of the presence of a fusible link 18 at the addressed location, the emitter electrode of isolation transistor 64a is at a voltage of 2.8 $V_{BE}$ (or approximately 2.2 volts). Because of the voltage drop between the collector and emitter electrodes of transistor $42_1$, a voltage in the order of 1.9 volts is produced at the emitter electrode of transistor $42_1$. Hence, further, the forward biased Schottky diode 20 produces approximately 0.7 of a volt between the anode and cathode thereof. It follows, then, that approximately 0.9 volts is developed across the fusible link 18. It is noted that fusible link 18 is here designed such that the amount of current passing through such link with 0.9 volts across it is insufficient to blow or fuse such fusible link. Referring again to isolation transistor 64a, under the address condition described and discussed above, the emitter electrode of such transistor has a voltage of approximately 2.8 $V_{BE}$ or approximately 2.2 volts. The collector electrode of such transistor then is at approximately 2.5 volts. Such 2.5 volts is insufficient in level to turn transistors 94, 92 and 90 to an "on" condition and hence the output at line $O_1$ is relatively high, indicating the presence of a logical 1 signal at the addressed location of memory 12a. The reference voltage $V_R$ is selected so that when transistor 64a is conducting, the voltage at the collector electrode thereof is below the level required to place transistor 90 in saturation, here 3.8 $V_{BE}$. However, the voltage at the collector electrode of transistor 64a, when conducting, should not be so low as to significantly slow down the switching action of the sense amplifier 86a. Here, to balance these two requirements, the collector electrode of transistor 64a, when conducting, is established at about 0.5 volts below 3.8 $V_{BE}$, such collector voltage being so established by the reference voltage $V_R$ of 3.0 volts (i.e., 3.8 $V_{BE}$) at the base electrode of transistor 64a. As discussed above, the Schottky diode 81 temperature compensates by temperature tracking so that $V_R$ changes in temperature as the switching threshold of sense amplifier 86a changes with temperature.

Let us consider now that the addressing signals on terminal $X_0$ is changed from a logical zero to a logical one, thereby changing the addressing from row conductor 14a to row conductor 14b. Under such condition, because of the absence of a fusible link electrically connected between row conductor 14b and column conductor 16a there is no current flow in the collector electrode of transistor $42_1$. In the absence of such current, the voltage between the base an emitter electrodes of isolation transistor 64a tends toward zero as that the voltage at the emitter electrode of such transistor goes to the reference voltage produced on the base electrode of such transistor $V_R$. A small change in the voltage between the base and emitter electrodes of transistor 64a causes a very large change in the amount of current in the collector of such transistor 64a. This large change in collector current causes rapid switching of transistors 94, 92 and 90 of sense amplifier 86. In particular, this large change in current flow as row conductor 14b is selected rapidly causes the sense amplifier 86 to become forward biased placing in saturation transistors 94, 92 and 90, thereby producing a relatively low voltage at the output line $O_1$, indicating that a logical 0 is stored at the location represented by row conductor 14b and column conductor $16a_1$.

In like manner, consider the case where initially the address signals on terminals $X_0$, $X_1$, $Y_0$, $Y_1$ are all logical zero signals. As described, under such condition the fusible link at the location indicated by row conductor 14a and column conductor 16a is selected. If the Y addressing signals are now changed such that a logical 1 signal is produced at terminal $Y_0$, thereby selecting transistor $42_2$, the absence of a fusible link fuse electrically connected at such address location causes the current in the emitter electrode of isolation transistor 64a to cease, producing a change in the voltage across the base and emitter junction of such transistor 64a. As discussed above, a relatively small change in such junction voltage causes a relatively large change of current in the collector electrode of transistor 64a which is sensed by the output network 68a and causing the sense amplifier 86 to rapidly switch from producing a logical 1 signal on line $O_1$ to a logical 0 signal on such line $O_1$. In this manner the isolation transistor 64a disposed between the pullup resistors 84 and the memory array 12a is biased in such a way that it will conduct current when an addressed fusible link is present and the large time constant caused by connecting the collector electrodes of transistors $42_1$ to $42_4$ together at the common terminal 44a is isolated from the switching action of the output network 68a thereby reducing propagation delay in the memory 10. It is noted that during programming a signal is fed to the programming logic circuit 17 via line EN. In response to such signal, terminals "A" and "B" are made low to disable the voltage references 66a-66d (hence disabling transistors 64a-64d) and the transistor 94, while a high level is fed to terminal "C" to enable transistors 103 and 105. Hence, programming current fed to terminals $O_1$-$O_4$ is fed to terminals 44a-44d, to memory arrays 12a-12d, and to fusible links 18 selected by the X, Y addressing signals. Once programmed, an operation signal is fed to the program logic circuit, via line EN. The low signals are removed from terminals "A" and "B" and a low signal is fed to terminal "C" to disable transistors 103 and 105 to enable operation as described above.

Figure 2:
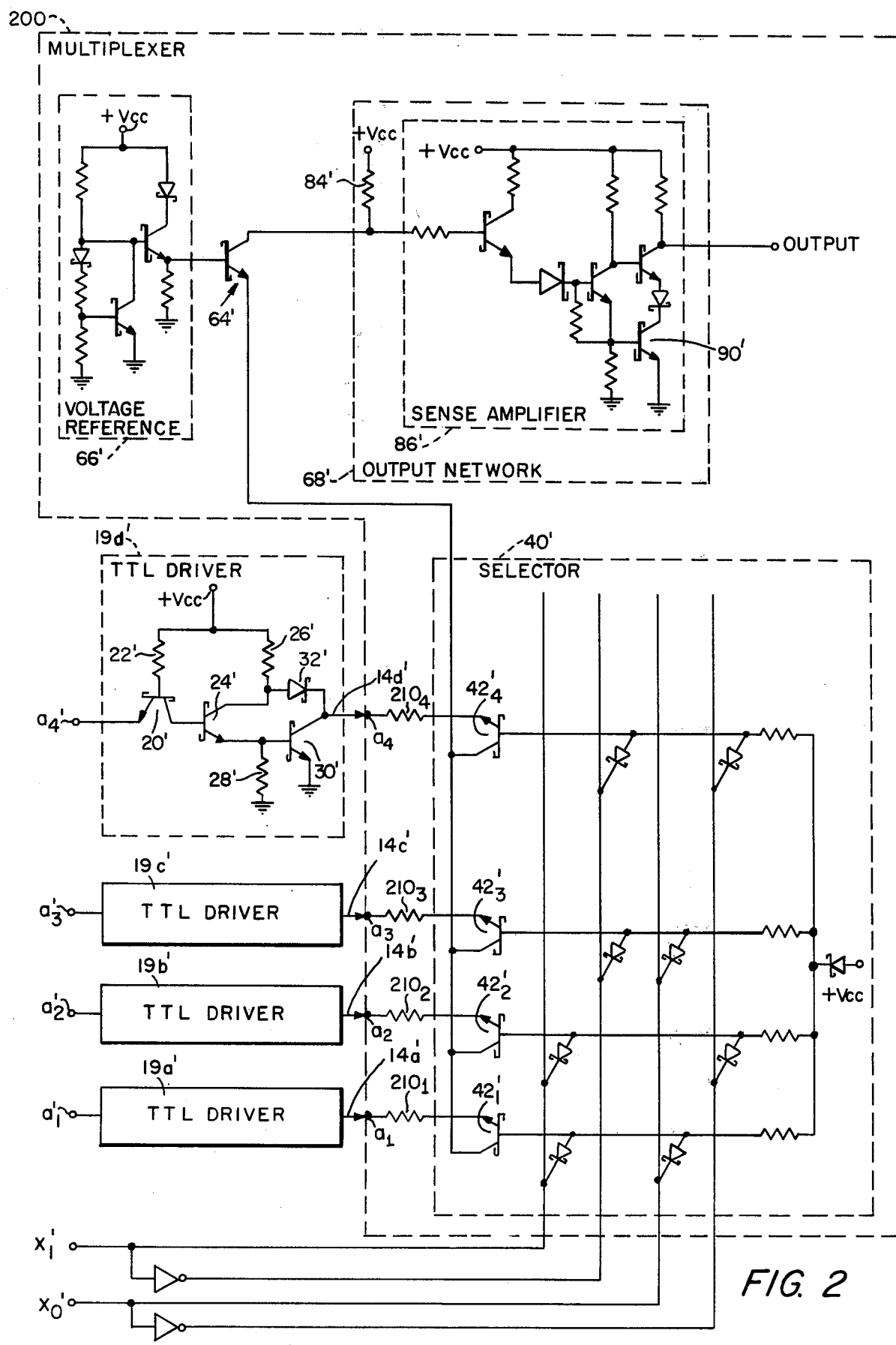
FIG. 2 is a schematic diagram of a multiplexer circuit according to the invention.

Referring now to FIG. 2, an alternate embodiment of the invention is shown. Here a multiplexer circuit 200 includes a selector network 40', a voltage reference circuit 66' and an output network 68' arranged as shown. It is noted that reference voltage circuit 66', output network 68' and selector network 40' are here equivalent to the voltage reference circuit 66, output network 68 and selector network 40 shown in FIG. 1. Here, however, the emitter electrodes of transistors $42_1'$ to $42_4'$ are connected to corresponding ones of input terminals $a_1$ to $a_4$, respectively, as shown, through resistors $210_1$ to $210_4$, respectively, as shown. Each one of the input terminals $a_1$ to $a_4$ is connected to logic signals fed to terminals $a_1'$ to $a_4'$ through a corresponding TTL driver 19a' to 19d', as shown. Each one of such drivers 19a' to 19d' is identical in construction and is here a conventional TTL driver. An exemplary one of such drivers, here TTL driver 19d', includes a Schottky transistor 20' having its emitter electrode connectd to terminal $a_4'$, its base electrode connected to $+V_{cc}$ through a resistor 22' and a collector electrode connected to the base electrode of Schottky transistor 24', as shown. The collector electrode of transistor 24' is connected to $+V_{cc}$ through a resistor 26', as shown. The emitter electrode of Schottky transistor 24' is connected to ground through resistor 28', as shown, and is connected to the base electrode of Schottky transistor 30', as shown. The emitter electrode of transistor 30' is grounded and the collector electrode of such transistor 30' is connected to the collector electrode of transistor 24' through a Schottky diode 32', as shown. Here, addressing signals produced at address terminals $X_0'$, $X_1'$ are used to couple a selected one of the logic signals fed to terminals $a_1'$ to $a_4'$ to the output network 68'.

In operation, let us consider, for purposes of example, a logic 0 signal, i.e. a low signal fed to terminal $a_4'$ and a logical 1 signal (i.e. a high signal) fed to terminals $a_1'$-$a_3'$. Let us also consider that initially transistor $42_3'$ is selected by producing a logical 0 signal at input terminal $X_1'$ and a logical 1 signal at $X_0'$. Under such condition a relatively low voltage, in the order of 0.3 volts, is produced by TTL driver 19c' on conductor 14c', coupling transistor 64' is biased in conducting condition and a relatively low voltage is produced at the collector electrode of such transistor 64', thereby causing output circuitry 68' to produce a relatively high voltage or logical 1 state signal at the output thereof. If the signals fed to the addressing terminals $X_1'$, $X_0'$ are now changed to select transistor $42_4'$, that is logical 0 signals are produced at both address terminals $X_0'$ and $X_1'$. The logical 0 signal fed to terminal $a_4'$ causes a relatively high voltage to be produced by TTL driver at conductor 14a', typically in the order of 4.5 volts. Such relatively high voltage back biases transistor $42_4'$ and prevents such transistor from passing current through the collector electrode thereof. Therefore, the current in the emitter electrode of transistor 64' ceases and the voltage between the base and emitter electrodes of such transistor 64′ decreases. A relatively small change in this voltage between the base and emitter electrodes of such transistor 64′, however, produces a relatively large decrease in the current in the collector electrode of transistor 64′ and such relatively large change in current is sensed by the output circuitry 68′ such that sufficient voltage is produced at the input of the circuit to turn on sense amplifier 86′ and to place transistor 90′ in a saturated condition, producing a relatively low voltage at the output of such transistor 90′ representing a logical 0 signal condition.

Having described a preferred embodiment of this invention, it is now evident that other embodiments incorporating these concepts may be used. It is felt, therefore, that this invention should not be restricted to the disclosed embodiment, but rather should be limited only by the spirit and scope of the appended claims.

What is claimed is:

1. An electronic circuit, comprising:
   (a) selector means for electrically coupling one of a plurality of conductors to a common terminal selectively in accordance with a control signal, including means for producing a voltage at such common terminal related to current flow through the selectively coupled one of the electrical conductors;
   (b) an output network; and
   (c) a transistor having a pair of electrodes serially connected between the common terminal and the output network.

2. The circuit recited in claim 1 including a voltage reference circuit connected to a third electrode of the transistor.

3. The circuit recited in claim 1 wherein the selector means includes a plurality of transistors, each one thereof having an emitter electrode and a collector electrode, one of such electrodes being connected to the common terminal and each one of the other electrodes being connected to a corresponding one of the plurality of conductors.

4. An electronic circuit, comprising:
   (a) selector means for electrically coupling one of a plurality of conductors to a common terminal selectively in accordance with a control signal producing a voltage at such common terminal related to current flow through the selectively coupled one of the plurality of conductors, such selector means comprising a plurality of transistors, each one having an emitter electrode and a collector electrode connected between a common terminal and a corresponding one of the plurality of conductors;
   (b) an output network; and
   (c) a transistor having collector and emitter electrodes connected between the output network and the common terminal.

5. The electronic circuit recited in claim 4 including means for producing a reference voltage at a base electrode of the last mentioned transistor.

6. An electronic circuit, comprising:
   (a) selector means for electrically coupling one of a plurality of conductors to a common terminal selectively in accordance with a control signal producing a voltage at such common terminal related to current flow through the selectively coupled one of the plurality of conductors, such selector means comprising a plurality of transistors, each one thereof having an emitter electrode and a collector electrode, the collector electrode of each one of the plurality of transistors being connected to the common terminal, the emitter electrode of each one of the plurality of transistors being connected to a corresponding one of the plurality of conductors;
   (b) a resistor having a first electrode adapted for coupling to a voltage source;
   (c) a first transistor having emitter and collector electrodes connected between the common terminal and a second electrode of the resistor; and
   (d) an output circuit having a second transistor, such second transistor having a base electrode coupled to the second electrode of the resistor.

7. An electronic circuit, comprising:
   (a) means for electrically coupling one of a plurality of conductors to a common terminal selectively in accordance with a control signal producing a voltage at such common terminal related to current flow through the selectively coupled one of the plurality of electrical conductors, such means including: a plurality of transistors, each one having emitter and collector electrodes, such collector electrode of each one of the plurality of transistors being connected to the common terminal, and each one of the emitter electrodes of the plurality of transistors being connected to a corresponding one of the plurality of conductors, the selected one of the plurality of conductors being electrically coupled to the common terminal through the emitter and collector electrodes of the one of the plurality of transistors having its emitter electrode connected to such selected one of the plurality of conductors;
   (b) a first transistor having a collector electrode and an emitter electrode, the emitter electrode being connected to the common terminal;
   (c) a resistor connected to the collector electrode of the first transistor;
   (d) a second transistor having a base electrode coupled to the resistor and the collector electrode of the first transistor; and
   (e) means for providing a reference voltage at the base electrode of the first transistor.

8. The electronic circuit recited in claim 7 wherein the electrical coupling means including means for coupling the control signals to base electrodes of the plurality of transistors.

9. The electronic circuit recited in claim 8 including a memory array of programmable elements coupled to the plurality of conductors.

10. An electronic circuit, comprising:
    (a) a plurality of transistors, each one having one emitter electrode and a collector electrode, the collector electrode of each one of the plurality of transistors being connected to a common terminal;
    (b) an output network;
    (c) a transistor having collector and emitter electrodes connected between the output network and the common terminal;
    (d) switching means for biasing selected ones of the plurality of transistors in accordance with control signals;
    (e) means, coupled to the emitter electrodes of the plurality of transistors, for enabling current flow between the common terminal and the emitter electrode of a first one of the plurality of transistors when such first one of the plurality of transistors is biased by the switching means in response to a first one of the control signals and for inhibiting current flow between the common terminal and the emitter electrode of a second one of the plurality of transistors when such second one of the plurality of transistors is biased by the switching means in response to a second one of the control signals.

11. An electronic circuit, comprising:
(a) a plurality of transistors, each one having an emitter electrode and a collector electrode connected between a common terminal and a corresponding one of a plurality of conductors;
(b) an output network;
(c) a transistor having collector and emitter electrodes coupled between the output network and the common terminal;
(d) switching means connected to base electrodes of the plurality of transistors for biasing selected ones of the plurality of transistors in accordance with control signals; and
(e) a plurality of logic circuit means, each one being coupled to a corresponding one of the conductors, each one of the plurality of logic circuit means being adapted to represent either a first or a second logic condition for enabling current to flow between the common terminal and one of the conductors connected to the biased one of the plurality of transistors when the one of the plurality of logic circuit means coupled to such one of the biased transistors represents the first logic condition and for inhibiting current flow between the common terminal and one of the conductors connected to the biased one of the plurality of transistors when the one of the plurality of logic circuit means coupled to such one of the biased transistors represents the second logic condition.

12. An electronic circuit, comprising:
(a) a plurality of electrical conductors;
(b) a plurality of transistors each one of such transistors being connected to a corresponding one of the plurality of electrical conductors, each one of such transistors having an emitter electrode and a collector electrode connected between a common terminal and a corresponding one of the plurality of electrical conductors;
(c) an output network having an input connected to a second terminal;
(d) resistor means connected between a voltage source and the second terminal, such voltage source being adapted to supply current to the second terminal through the resistor means;
(e) an additional transistor having a base electrode or collector electrode, and an emitter electrode, the collector and emitter electrodes being connected between the second terminal and the common terminal;
(f) a voltage reference source connected to the base electrode of the additional transistor;
(g) switching means connected to base electrodes of the plurality of transistors, for coupling a bias signal to a first one of the plurality of transistors in response to a first control signal and for removing such bias signal from the first one of the plurality of transistors while coupling a bias signal to a second one of the plurality of transistors in response to a second control signal;
(h) means including a plurality of logic circuit means, each one being coupled to a corresponding one of the plurality of electrical conductors, a first one of the logic circuit means being coupled to the one of the electrical conductors connected to the first one of the plurality of transistors and a second one of the logic circuit means being coupled to the one of the plurality of electrical conductors connected to the second one of the plurality of transistors, for enabling current flow from the voltage source, through the common terminal, the collector and emitter electrodes of the first one of the plurality of transistors to the first one of the logic circuit means when the switch means couples the bias signal to such first one of the plurality of transistors in response to the first control signal and for inhibiting such current flow through the common terminal and the collector and emitter electrodes of the second one of the plurality of transistors to the second one of the logic circuit means when the switching means couples the bias signal to the second one of the plurality of transistors in response to the second control signal.

13. An electronic circuit, comprising:
(a) a plurality of transistors, each one having a base electrode, an emitter electrode and a collector electrode, the collector electrodes of each one of the plurality of transistors being connected to a common terminal;
(b) switching means connected to the base electrodes to the plurality of transistors for biasing selected ones of the plurality of transistors in accordance with control signals;
(c) means coupled to the emitter electrodes of the plurality of transistors for enabling current flow between the common terminal and the emitter electrode of a first one of the plurality of transistors when such first one of the plurality of transistors is biased by the switching means in response to a first one of the control signals producing a voltage at the common terminal and for inhibiting current flow between the common terminal and the emitter electrode of a second one of the plurality of transistors when such second one of the plurality of transistors is biased by the switching means in response to a second one of the control signals changing the voltage produced at the common terminal;
(d) means, including an additional transistor having collector and emitter electrodes connected between a second terminal and the common terminal, for sensing the change in voltage at the common terminal and, in response to such sensed voltage change, changing the level of a voltage at the second terminal;
(e) an output network having an input connected to the second terminal, such output network including means for switching a logic state of a logic signal produced by such output network in response to the change in voltage at the second terminal.

14. An electronic circuit, comprising:
(a) a plurality of loads, each one thereof having either an open circuit condition or a closed circuit condition;
(b) a plurality of transistors each one having an emitter electrode connected to a corresponding one of the plurality of loads and a collector electrode connected to a common terminal, a first one of the plurality of transistors having the emitter electrode thereof connected to one of the plurality of loads having the closed circuit condition and a second one of the plurality of transistors having the emitter electrode thereof connected to one of the plurality of loads having an open circuit condition;

(c) a resistor means having a first terminal adapted for coupling to a voltage source, and a second terminal;

(d) means, connected to base electrodes of the plurality of transistors, for forward biasing the first one of the plurality of transistors in response to a first control signal, the closed circuit condition of the one of the plurality of loads connected to the first one of the transistors enabling current to flow from the voltage source, through the resistor means to the common terminal and from the common terminal through the collector and emitter electrodes of the first one of the plurality of transistors to the one of the plurality of loads having the closed circuit condition connected to the emitter electrode of the first one of the plurality of transistors producing a voltage at the common terminal, and for removing the forward bias from the first one of the plurality of transistors while forward biasing the second one of the plurality of transistors in response to the second control signal, the open circuit condition of the one of the plurality of loads connected to the emitter electrode of the second one of the plurality of transistors inhibiting current flow through the common terminal to the emitter electrode of the second one of the plurality of transistors changing the voltage produced at the common terminal;

(e) means, including an additional transistor having a base electrode connected to a reference voltage means, and collector and emitter electrodes connected between the second terminal and the common terminal, for sensing the change in voltage produced at the common terminal and, in response to such sensed voltage change, changing the level of current flow through the resistor means to change a voltage at the second terminal;

(f) an output network, having an input connected to the second terminal, such output network having means, for switching a logic state of a logic signal produced by such output network in response to the change in voltage at the second terminal.

* * * * *

UNITED STATES PATENT OFFICE
CERTIFICATE OF CORRECTION

Patent No. 4,276,617                 Dated June 30, 1981

Inventor(s) Hiep T. Le

It is certified that error appears in the above-identified patent and that said Letters Patent are hereby corrected as shown below:

Column 2, line 19, delete "electrodes" and replace with --electrode--;

Column 7, line 22, delete "an" and replace with --and--;

Column 7, line 23, delete "as" and replace with --so--;

Column 8, line 30, delete "connectd" and replace with --connected--;

Column 12, line 31, delete "to" and replace with --of--.

Signed and Sealed this

*Thirty-first* Day of *August 1982*

[SEAL]

*Attest:*

*Attesting Officer*

GERALD J. MOSSINGHOFF

*Commissioner of Patents and Trademarks*